United States Patent
Ong et al.

(10) Patent No.: US 11,031,359 B2
(45) Date of Patent: Jun. 8, 2021

(54) CAPACITOR LOOP STRUCTURE

(71) Applicant: Intel Corporation, Santa Clara, CA (US)

(72) Inventors: Jenny Shio Yin Ong, Bayan Lepas (MY); Tin Poay Chuah, Bayan Baru (MY); Chin Lee Kuan, Bentong (MY)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 16/462,197

(22) PCT Filed: Nov. 20, 2017

(86) PCT No.: PCT/US2017/062513
§ 371 (c)(1),
(2) Date: May 17, 2019

(87) PCT Pub. No.: WO2018/118307
PCT Pub. Date: Jun. 28, 2018

(65) Prior Publication Data
US 2019/0279949 A1    Sep. 12, 2019

(30) Foreign Application Priority Data
Dec. 20, 2016 (MY) .......................... PI 2016704710

(51) Int. Cl.
*H01R 9/00* (2006.01)
*H01L 23/64* (2006.01)
(Continued)

(52) U.S. Cl.
CPC ...... *H01L 23/642* (2013.01); *H01L 23/49816* (2013.01); *H01L 23/50* (2013.01);
(Continued)

(58) Field of Classification Search
CPC . H01L 23/642; H01L 23/50; H01L 23/49816; H01L 23/49833; H01L 23/13;
(Continued)

(56) References Cited

U.S. PATENT DOCUMENTS

| 6,392,899 B1* | 5/2002 | Harrison ................. G06F 1/189 248/610 |
| 8,018,738 B2* | 9/2011 | Doblar ................. H05K 1/0262 361/803 |

(Continued)

OTHER PUBLICATIONS

International Search Report and Written Opinion dated Mar. 5, 2018 for International Patent Application No. PCT/US2017/062513, 16 pages.

*Primary Examiner* — Yuriy Semenenko
(74) *Attorney, Agent, or Firm* — Schwabe, Williamson & Wyatt, P.C.

(57) ABSTRACT

A capacitor loop substrate assembly may include a substrate with a loop shape, one or more capacitors or other electronic components on the substrate, and an opening in the substrate to allow the capacitor loop substrate assembly to be coupled to an integrated circuit package, such as a package including a die. Interconnects and/or contacts for interconnects may be formed in an integrated circuit package to couple the capacitor loop substrate assembly to the integrated circuit package.

6 Claims, 9 Drawing Sheets

(51) Int. Cl.
*H01L 23/498* (2006.01)
*H05K 1/18* (2006.01)
*H05K 1/02* (2006.01)
*H01L 23/50* (2006.01)
*H01L 23/13* (2006.01)

(52) U.S. Cl.
CPC ........... *H05K 1/0231* (2013.01); *H05K 1/181* (2013.01); *H01L 23/13* (2013.01); *H01L 23/49833* (2013.01); *H05K 2201/10015* (2013.01); *H05K 2201/1053* (2013.01); *H05K 2201/10378* (2013.01); *H05K 2201/10515* (2013.01); *H05K 2201/10522* (2013.01); *H05K 2201/10734* (2013.01); *H05K 2201/2018* (2013.01)

(58) Field of Classification Search
CPC .............. H05K 1/0231; H05K 1/181; H05K 2201/2018; H05K 2201/10015; H05K 2201/10378; H05K 2201/10515; H05K 2201/10522; H05K 2201/1053; H05K 2201/10734
See application file for complete search history.

(56) References Cited

U.S. PATENT DOCUMENTS

| | | | |
|---|---|---|---|
| 9,456,498 B2 * | 9/2016 | Christo | H05K 1/112 |
| 2002/0114129 A1 * | 8/2002 | Dibene, II | H05K 1/144 |
| | | | 361/601 |
| 2002/0131256 A1 | 9/2002 | Smith et al. | |
| 2003/0057548 A1 * | 3/2003 | Hartke | G06F 1/189 |
| | | | 257/718 |
| 2003/0147225 A1 | 8/2003 | Thomas, Jr. et al. | |
| 2009/0244807 A1 * | 10/2009 | Lee | H01G 4/30 |
| | | | 361/306.2 |
| 2013/0221485 A1 | 8/2013 | Kim et al. | |

* cited by examiner

CAPACITOR LOOP STRUCTURE

CROSS REFERENCE TO RELATED APPLICATIONS

The present application is a national phase entry under 35 U.S.C. § 371 of International Application No. PCT/US2017/062513, filed Nov. 20, 2017, entitled "CAPACITOR LOOP STRUCTURE", which claims priority to Malaysian Application PI 2016704710, filed Dec. 20, 2016, entitled "CAPACITOR LOOP STRUCTURE." PCT/US2017/062513 designated, among the various States, the United States of America. The Specification of the PCT/US2017/062513 Application is hereby incorporated by reference.

FIELD

Embodiments of the present disclosure generally relate to the field of materials for integrated circuit (IC) assemblies, and more particularly, to a package including capacitors.

BACKGROUND

When designing printed circuit boards ("PCBs") for computers, smaller size provides advantages, such as more space available for batteries, increased density on racks, and the like.

A "package", "package assembly" or "package substrate" is a mount to mechanically and/or electronically connect a "die" to another component, such as another package, a PCB or motherboard, or the like. A "die" may be an integrated circuit and may include, or be a part of, a processor, memory, system-on-chip (SoC), application-specific integrated circuit (ASIC) or the like. A die may represent a discrete product made from a semiconductor material (e.g., silicon) using semiconductor fabrication techniques such as thin film deposition, lithography, etching, and the like used in connection with forming complementary metal-oxide-semiconductor ("CMOS") devices.

Packages protect the die from environmental conditions, transfer heat, and facilitate physical and electronic connection with other components. In addition to dies, packages may also comprise other electronic components, such as capacitors. The dies and other components are chemically bonded and/or mechanically connected to a substrate. The substrate frequently contains through-holes, vias, or the like for conductors; the conductors form electrical connections between the die and the other component(s). Such electrical connections are also referred to herein as "interconnects". Interconnects may also include waveguides, including waveguides for electromagnetic radiation (photons).

Capacitors are a common passive electrical component in packages. When placed close to an integrated circuit, capacitors reduce package electrical impedance and enable an overall system to maintain consistent voltage across operating frequencies.

Capacitors, however, may occupy space. When reduced in size, capacitors may become less reliable. Locations for capacitors include the following: i) between a board and a substrate, such as below a die (referred to as a land-side capacitor or "LSC"); ii) on top of a substrate and adjacent to a die (referred to as a "die-side capacitor" or "DSC"); within a substrate (referred to as an "embedded capacitor"); on a board, such as proximate to an edge of a package (referred to as a "board edge capacitor"); and within a board, such as in a cavity or recess in a board (also referred to as "recess in motherboard" or "RiMB").

DSC is recognized as providing greater power delivery integrity than LSC or board edge capacitors; however, signal routing in conductors on top of or in the substrate may not provide enough space for DSC.

DETAILED DESCRIPTION

Figure 1A:
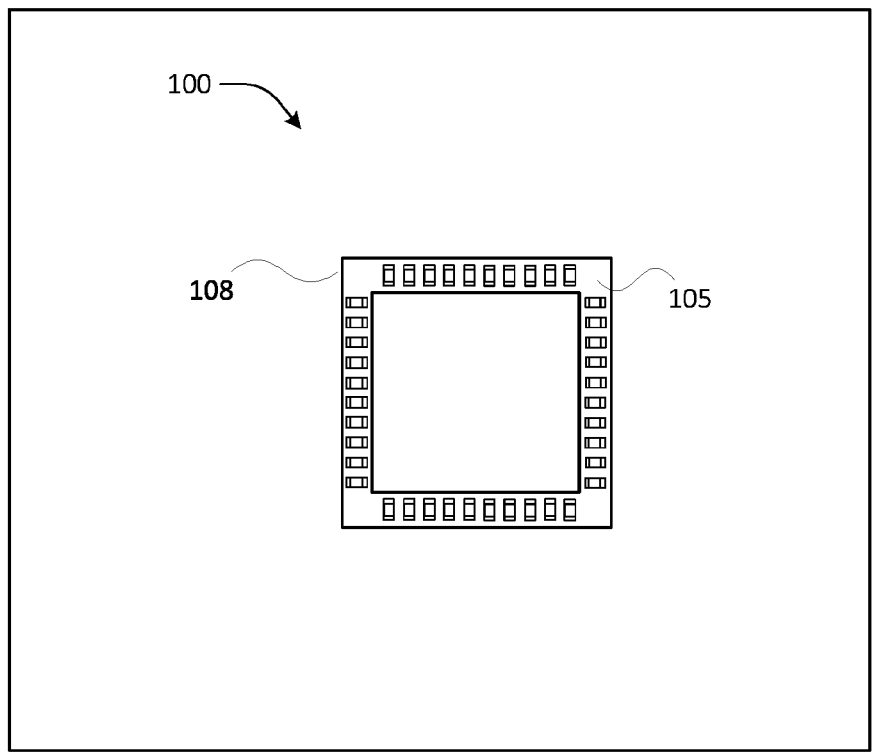
FIG. 1A illustrates an example of a power loop structure from a top view and in accordance with some embodiments.

As discussed at greater length herein, disclosed is a capacitor loop substrate assembly, also referred to herein as a "power loop", and related structures. The power loop includes a substrate, one or more capacitors or other electronic components on the substrate, and an opening in the substrate to allow the power loop to be coupled to an integrated circuit package, such as a package including a die. Related structures include interconnects and/or contacts for interconnects in an integrated circuit package to couple the power loop to the integrated circuit package. The power loop provides effective power integrity with a short inductance loop compared to LSC or board edge capacitors, without the need to increase package size, without and/or with reduced LSC (which may also allow reduced ball pitch size, if LSC are reduced or eliminated), with improved power delivery integrity, and/or without or with reduced RiMB. These advantages may reduce costs and increase packaging options.

As used herein, a "loop" is a path or structure which starts and ends at the same point. A loop may follow any geometric shape. As used herein, a loop around a hole is a geometric shape with a volume, such as a square, a circle, a triangle, or the like, wherein the volume of the geometric shape comprises an opening, hole, gap, or the like, surrounded by the remaining volume of the geometric shape. The opening, hole, or the like is not necessarily geometrically similar to a perimeter of the loop (the perimeter of the loop may define a square, while the hole in the loop may be a circle). As used herein, a "broken loop" is a loop around a hole, wherein the loop around the hole comprises a missing portion, wherein the missing portion could be completed by at least a partial rotation of the loop around the hole.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and which illustrate embodiments of the present disclosure. It is to be understood that other embodiments may be utilized and structural or logical changes may be made without departing from the scope of the present disclosure. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," or "in some embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

FIG. 1A illustrates an example of a power loop 100 structure from a top view and in accordance with some embodiments. Power loop 100 is illustrated as comprising capacitor substrate 105, external perimeter 108, inner perimeter 110, and a plurality of capacitor 115, arrayed on each side of capacitor substrate 105. Capacitor substrate 105 is illustrated as a square, but may encompass or include other geometric shapes and combinations thereof. Capacitor substrate 105 may also be described herein as a "substrate".

Instead of and/or in addition to capacitor 115, other electronic and/or structural components may be placed on or incorporated into or onto capacitor substrate 105, such as integrated circuit assemblies, vias, flanges, bumps, pads other electronic and/or structural components and the like. "Capacitor 115" is illustrated as an example and may be understood to encompass other structural and/or electronic components.

Power loop 100 and capacitor substrate 105 are illustrated herein as being symmetrical and continuous (without a break in capacitor substrate 105) for ease of understanding. Power loop 100 and capacitor substrate 105 may be asymmetric or may follow another simple or compound geometric shape, such as a rectangle, a regular or irregular trapezoid, a triangle, an oval (including a circle), or a combination thereof. In some embodiments, power loop 100 may be discontinuous, e.g. with a break spanning from external perimeter 108 to inner perimeter 110 of capacitor substrate 105.

A negative space, opening, or hole (which, herein, are synonymous terms) within power loop 100 may be defined by inner perimeter 110 of capacitor substrate 105.

In FIG. 1A, a plurality of capacitor 115 are illustrated as being located between external perimeter 108 and inner perimeter 110, with a longitudinal axis of each capacitor 115 generally being oriented toward a center of capacitor substrate 105 and in parallel with the longitudinal axis of other capacitors 115 on a side of capacitor substrate 105. In some embodiments, one or more capacitor 115 (or other components) may be offset, relative to external perimeter 108 and inner perimeter 110 and/or may have another orientation and/or may not be symmetrically arrayed. Generally, a greater or lesser number of capacitors may be used as well as capacitors of different size.

Capacitor substrate 105 may be composed of an electrically insulative material such as an epoxy laminate, which material may be flexible or rigid. For example, capacitor substrate 105 may include electrically insulating layers composed of materials, such as polytetrafluoroethylene, phenolic cotton paper materials such as Flame Retardant 4 (FR-4), FR-1, cotton paper, and epoxy materials such as CEM-1 or CEM-3, or woven glass materials that are laminated together using an epoxy resin, a glass epoxy, a ceramic, a rigid plastic, a flexible plastic, or the like. Capacitor substrate 105 may be composed of other suitable materials in other embodiments.

Figure 4A:
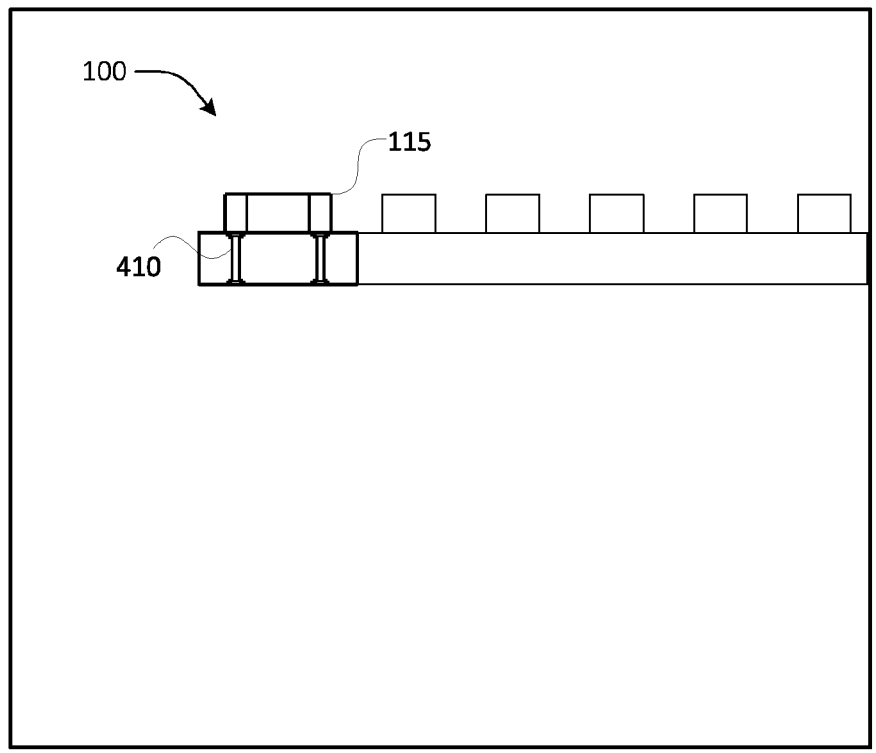
FIG. 4A illustrates a section cut of an elevation view of the example power loop structure of FIG. 1A, in accordance with some embodiments.
Figure 4B:
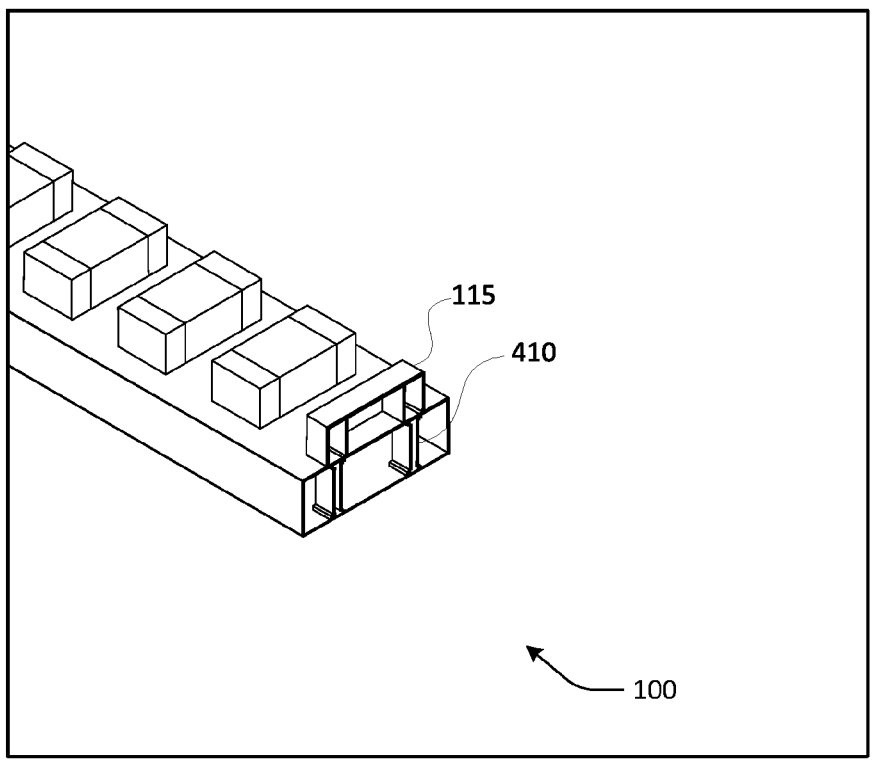
FIG. 4B illustrates a parallel projection isometric view of the section cut of the example power loop structure of FIG. 4A, in accordance with some embodiments.

As further discussed in relation to, for example, FIGS. 4A and 4B, interconnect structures such as traces, trenches or vias may be formed through the electrically insulating layers of capacitor substrate 105 to route electrical signals and/or power from an attached or coupled component, such as capacitor 115. Capacitor 115 and interconnect structures in capacitor substrate 105 may be bonded by way of an anisotropic conductive film, solder, or the like.

Figure 1B:
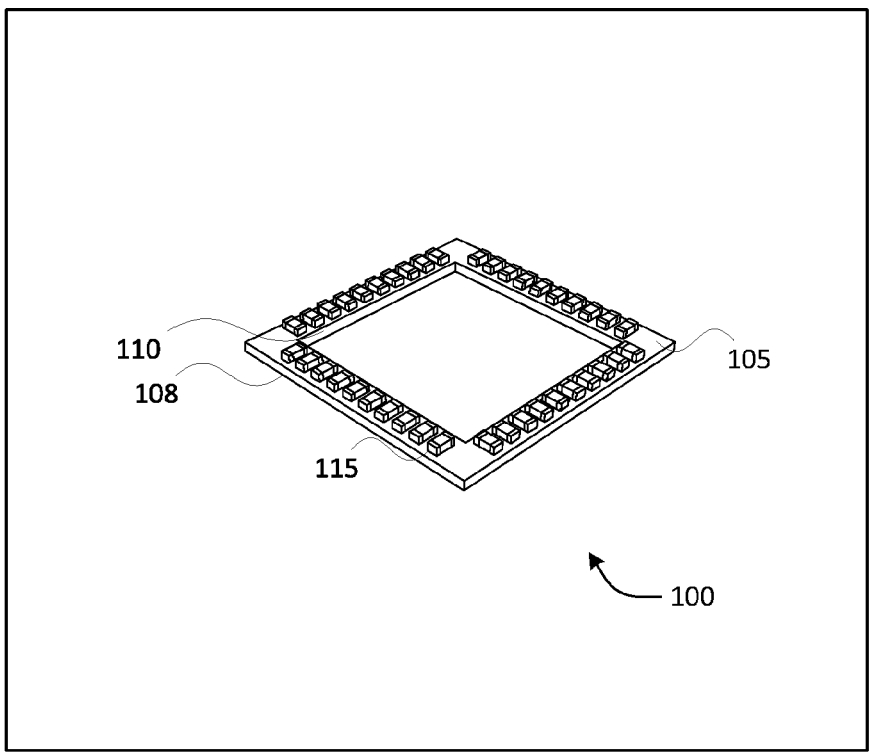
FIG. 1B illustrates a perspective isometric view of the example power loop of FIG. 1A, in accordance with some embodiments.

FIG. 1B illustrates a perspective isometric view of example power loop 100, in accordance with some embodiments, including capacitor substrate 105, external perimeter 108, inner perimeter 110, and a plurality of capacitor 115. A top of power loop 100, for example, the side with capacitor 115, may be characterized as an "inactive side", while a bottom of power loop 100, for example, the side distal to capacitor 115, may be characterized as an "active side".

Figure 2A:
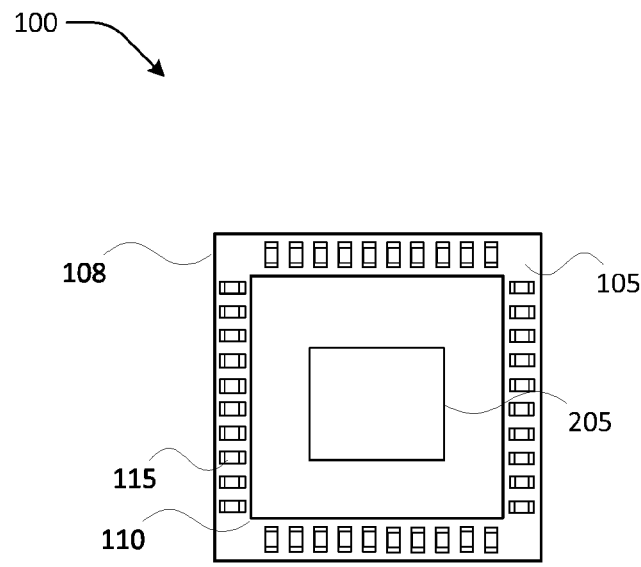
FIG. 2A illustrates a top view of the example power loop structure of FIG. 1A, around a die and coupled to a package substrate, in accordance with some embodiments.

FIG. 2A illustrates a top view of example power loop 100 structure of FIG. 1A, around die 205 and coupled to a package substrate, in accordance with some embodiments. Package substrate is more clearly illustrated in, for example, in FIGS. 5A-7. "Package substrate" may also be referred to herein as an "integrated circuit package".

Figure 2B:
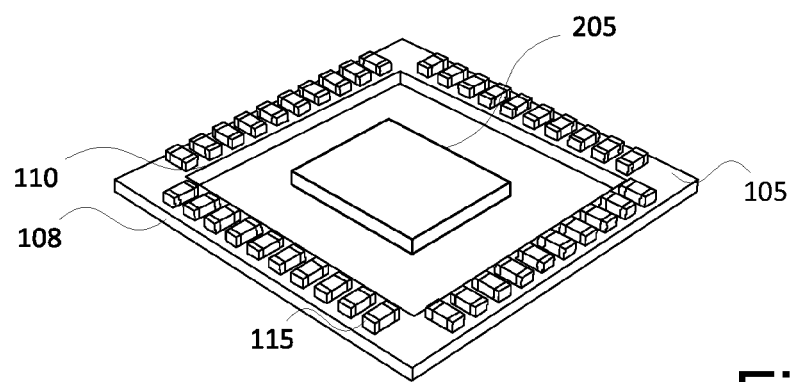
FIG. 2B illustrates a perspective isometric view of the example power loop, package substrate, and die structure of FIG. 2A, in accordance with some embodiments.

FIG. 2B illustrates a perspective isometric view of example power loop 100, die 205 and package substrate of FIG. 2A, in accordance with some embodiments. FIGS. 2A and 2B illustrate that the opening defined by inner perimeter 110 surrounds die 205. FIGS. 2A and 2B may be understood to illustrate an example of power loop 100 after a fabrication step to couple power loop 100 to package substrate and die 205 assembly.

The opening defined by inner perimeter 110 may be determined to accommodate the external edge of die 205 and interconnect structures in capacitor substrate 105 and in the package substrate coupled to die 205. The number, spacing, orientation, and configuration of the plurality of capacitor 115 may be determined according to system requirements and to provide coupling to interconnect structures and other electrical components in package substrate and die 205.

Figure 3A:
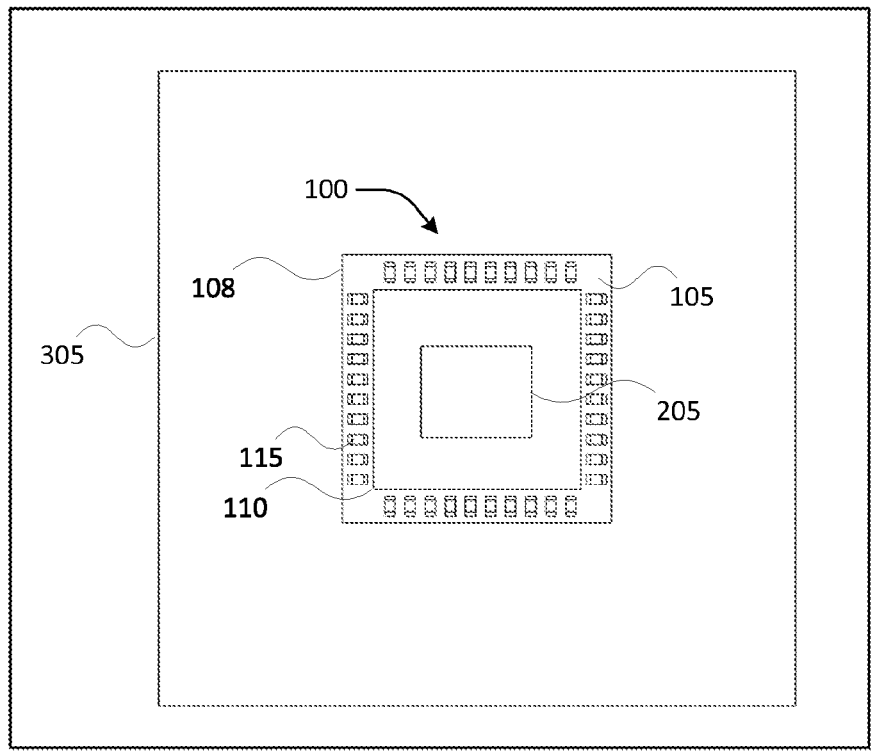
FIG. 3A illustrates a top view of the example power loop structure of FIG. 1A, coupled to a package substrate, wherein the package substrate may be coupled to a die and a PCB, in accordance with some embodiments.
Figure 3B:
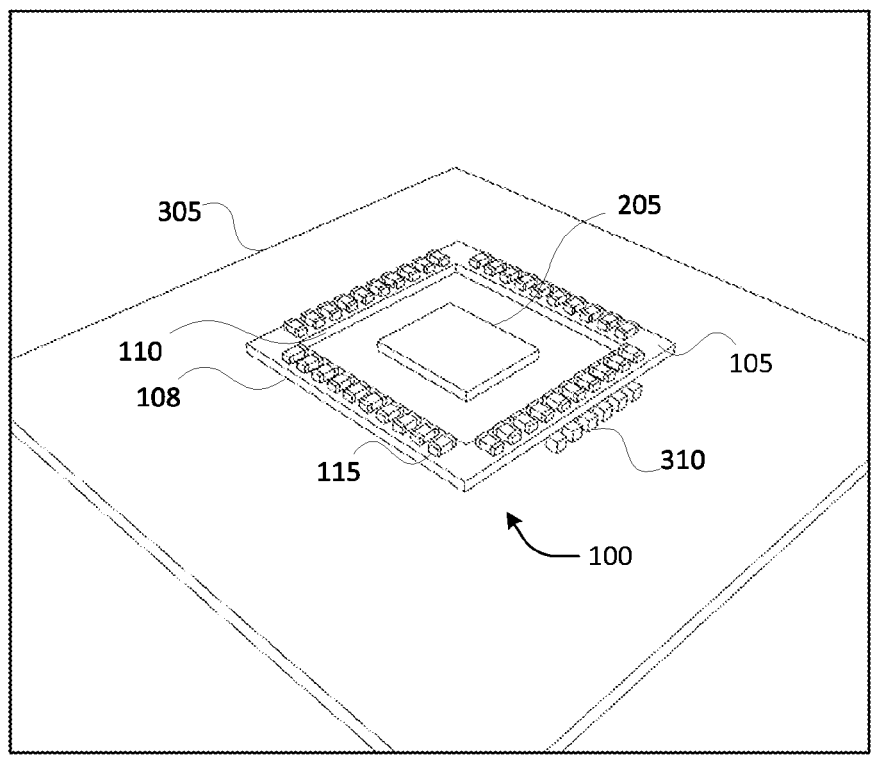
FIG. 3B illustrates a perspective isometric view of the example power loop, package substrate, die, and PCB structure of FIG. 3A, in accordance with some embodiments.

FIG. 3A illustrates a top view of example power loop 100 of FIG. 1A, coupled to a package substrate, wherein the package substrate may be coupled to die 205 and PCB 305, in accordance with some embodiments. FIG. 3B illustrates a perspective isometric view of example power loop 100, package substrate, die 205, and PCB 305 of FIG. 3A, in accordance with some embodiments. FIGS. 3A and 3B may be understood to illustrate an example of power loop 100 after fabrication steps to couple power loop 100 to package substrate and die 205 assembly and fabrication steps to couple package substrate and die 205 to PCB 305.

PCB 305 may comprise capacitors and other electronic and/or structural components. By way of example, FIG. 3B illustrates a plurality of PCB capacitor 310, located below die 205, next to and/or below package substrate, and below power loop 100. An example of a physical relationship between PCB capacitors 310, power loop 100, die 205 and package substrate 505 is further illustrated in FIGS. 6A and 6B. PCB 305 may be formed of materials similar to those used to form capacitor substrate 105; PCB 305 may also be characterized as having "active" and "inactive" sides.

FIG. 4A illustrates a section cut of an elevation view of example power loop 100 of FIG. 1A, in accordance with some embodiments. FIG. 4B illustrates a parallel projection isometric view of the example power loop structure of FIG. 4A, in accordance with some embodiments. Via 410 illustrated in FIGS. 4A and 4B (which comprises two interconnect structures) is an example of an interconnect or other electronic structure which may be formed in power loop 100 and capacitor substrate 105. In the examples illustrated herein, via 410 may provide a conduit, waveguide, or other interconnect between i) capacitor 115 and other components on the inactive side of power loop 100 and ii) components on the active side of power loop 100, such as pads and/or interconnect structures in package substrate. Via 410 may comprise a first conducting pad in contact with capacitor 115, a second conducting pad on a face of capacitor substrate 105 opposite capacitor 115, and a plated through-hole or conducting line, connecting the conducting pads.

Figure 5A:
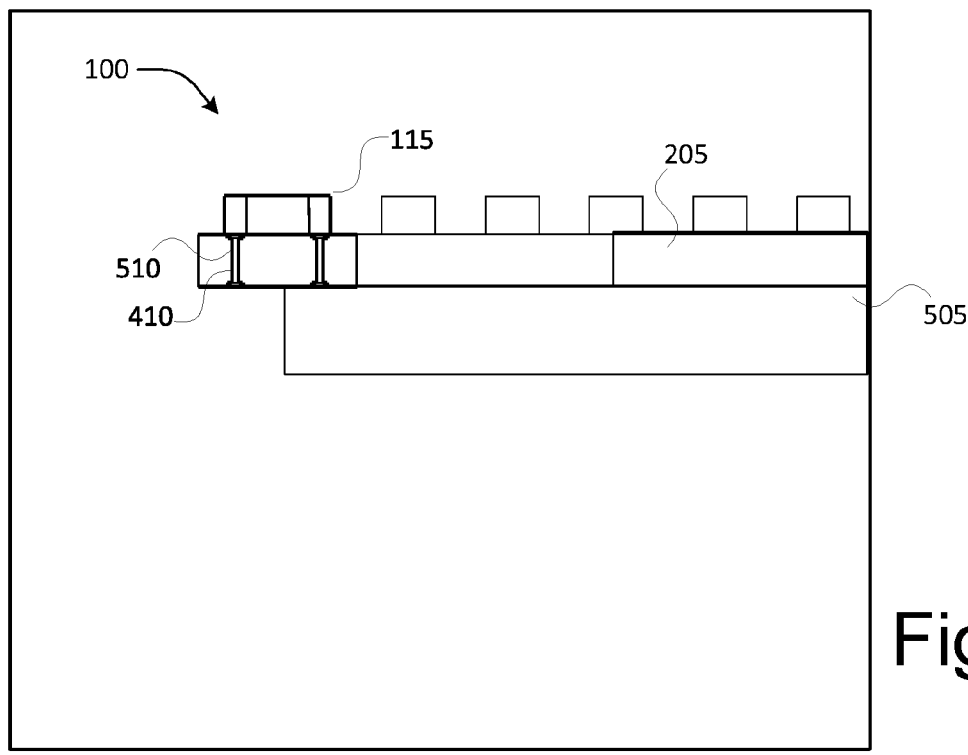
FIG. 5A illustrates a section cut of an elevation view of the example power loop structure of FIG. 1A, coupled to a package substrate and wherein the package substrate is coupled to a die, in accordance with some embodiments.
Figure 5B:
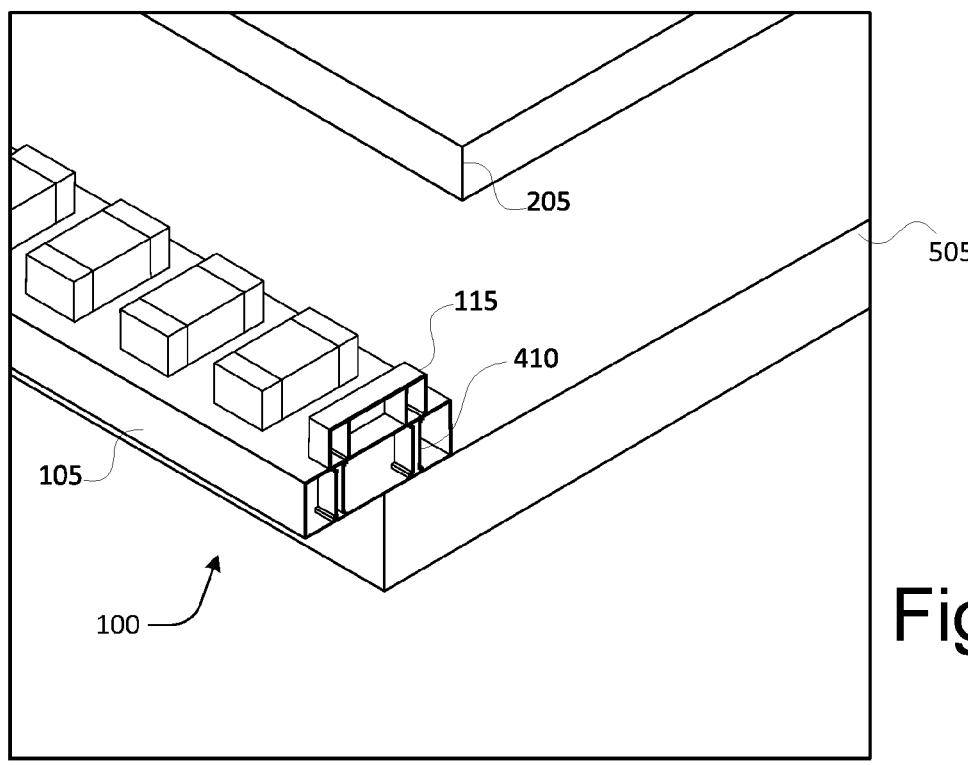
FIG. 5B illustrates a parallel projection isometric view of the section cut of the example power loop structure, package substrate, and die of FIG. 5A, in accordance with some embodiments.

FIG. 5A illustrates a section cut of an elevation view of example power loop 100 of FIG. 1A, coupled to package substrate 505, which may be coupled to die 205, in accordance with some embodiments. FIG. 5B illustrates a parallel projection isometric view of example power loop 100 and die 205 and package substrate 505 of FIG. 5A, in accordance with some embodiments. FIGS. 5A and 5B may be understood to illustrate an example of power loop 100 after a fabrication step to couple power loop 100 to package substrate 505 and die 205 assembly. By way of example, coupling of power loop 100 to package substrate 505 may be by way of bumps, pillars, solder, solder balls, anisotropic conductive film, or other suitable structures.

As illustrated in FIGS. 5A and 5B, package substrate 505 may not extend to the external perimeter of capacitor substrate 105 and may contact or couple with one of via 410. FIGS. 5A and 5B may be understood to illustrate an example of power loop 100 after fabrication steps to couple power loop 100 to package substrate 505 and die 205 assembly. FIGS. 5A and 5B illustrate an example of physical and electronic coupling of capacitor substrate 105 and via 410 to another structure; other examples may include a complete overlap, coupling to multiple interconnect structures, including multiple different interconnect structures. Package substrate 505 may be formed of materials similar to those used to form capacitor substrate 105 and package substrate 505 and may contain multiple electronic, optical and/or structural components.

Figure 6A:
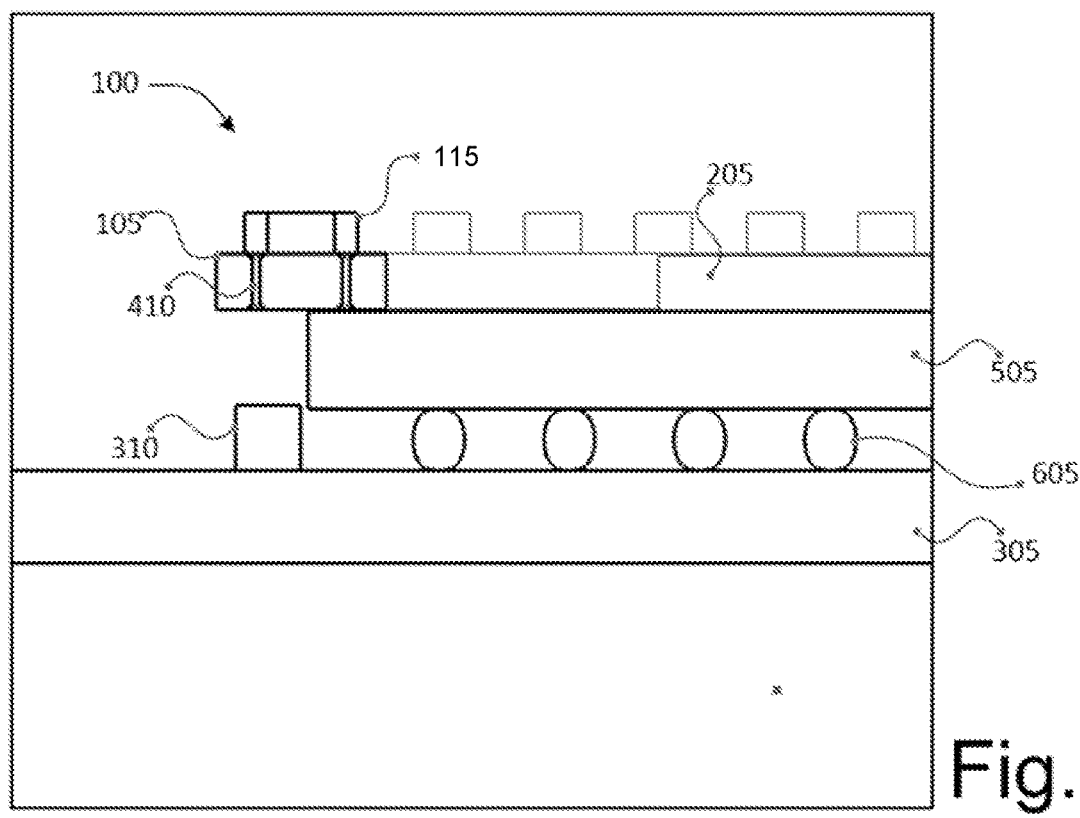
FIG. 6A illustrates a section cut of an elevation view of the example power loop structure of FIG. 1A, coupled to a package and wherein package is coupled to a die and a PCB, in accordance with some embodiments.
Figure 6B:
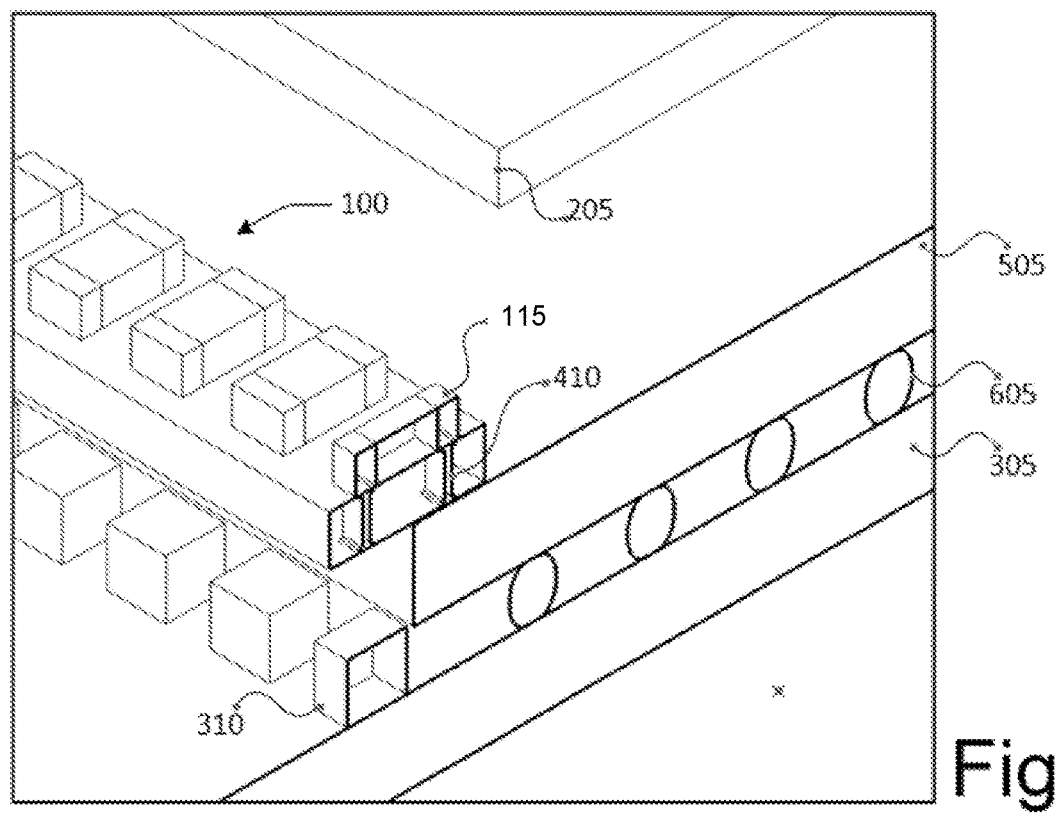
FIG. 6B illustrates a section cut of a parallel projection isometric view of the example power loop structure, package substrate, die, and PCB of FIG. 6A, in accordance with some embodiments.

FIG. 6A illustrates a section cut of an elevation view of example power loop 100 of FIG. 1A coupled to package substrate 505, wherein package substrate 505 is coupled to die 205 and PCB 305, in accordance with some embodiments. FIG. 6B illustrates a section cut of a parallel projection isometric view of example power loop 100, die 205, package substrate 505, PCB 305 of FIG. 6A, in accordance with some embodiments. FIGS. 6A and 6B may be understood to illustrate an example of power loop 100 after fabrication steps to couple power loop 100 to package substrate 505 and die 205 assembly and fabrication steps to couple package substrate 505 and die 205 to PCB 305. By way of example, illustrated in FIGS. 6A and 6B is a plurality of PCB capacitor 310, shown next to package substrate 505 and below power loop 100. In the example illustrated in FIG. 6A, coupling of package substrate 505 to PCB 305 is by way of a plurality of solder ball 605. In this example, power loop 100 may allow PCB capacitor 310 to be located next to package substrate 505 and below power loop 100, which may provide for a reduction in the height of the plurality of solder ball 605.

Example heights of certain of the components in FIGS. 6A and 6B may be as follows, in Table 1:

TABLE 1

| Component | Height |
| --- | --- |
| die 205 | 0.3 mm |
| package substrate 505 | 0.531 mm |
| PCB capacitor 310 | 0.35 mm |
| capacitor substrate 105 | 0.3 mm |
| capacitor 115 | 0.22 mm |
| solder balls 605 | 0.326 mm |

For example, a highest component on a PCB, such as PCB 305, may be a Solid State Drive ("SSD") with a height of approximately 1.6 mm. This may be higher than the combined heights of capacitor 115, capacitor substrate 105, package substrate 505, and solder balls 605 (which, in this example, may total 1.377 mm), in which case such combined heights are not the limiting factor for the overall height of the combined assembly including the SSD. By using the capacitor substrate 105 rather than legacy alternatives for placing capacitors, examples of benefits may include the following: high power delivery integrity compared to LSC or board edge capacitors; avoid problems of additional signal routing conductors for capacitors on top of or in die 205; avoid complexity of placing capacitors within package substrate 505 or PCB 305; use smaller solder balls than might otherwise be required, if larger LSC were present (for example, due to lower power delivery integrity of LSC).

Figure 7:
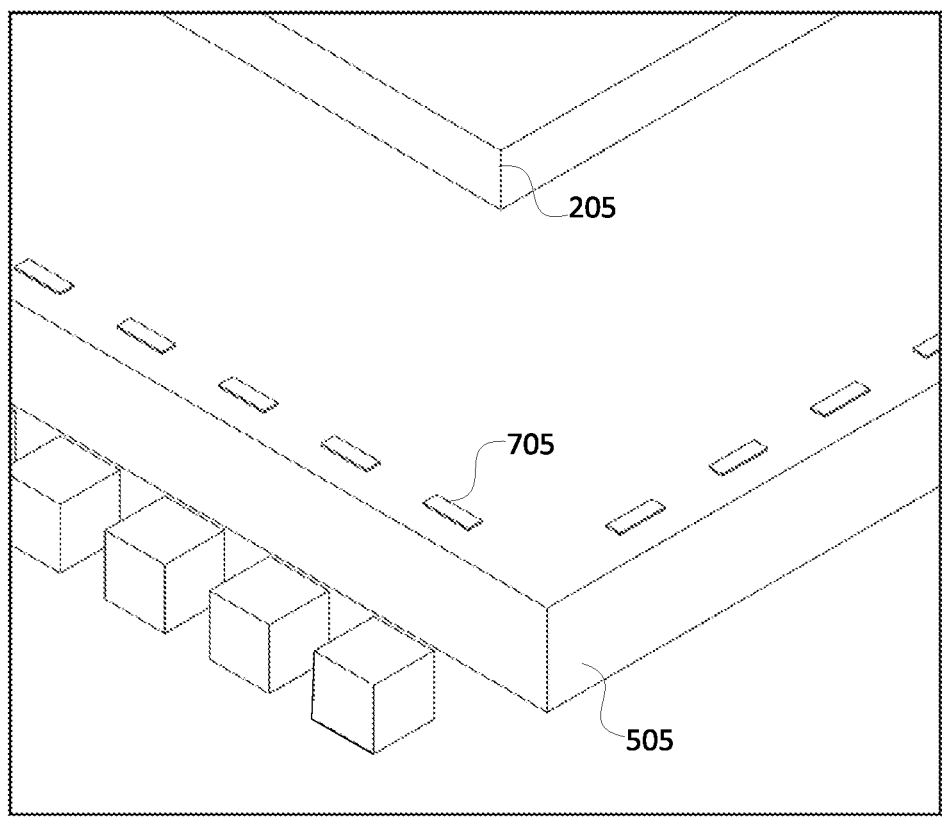
FIG. 7 illustrates a parallel projection isometric view of the die, package substrate, and PCB of FIG. 6A, configured to be coupled to the power loop structure of FIG. 1A.

FIG. 7 illustrates a parallel projection isometric view of die 205 and package substrate 505 of FIG. 5A, configured to couple with example power loop 100 of FIG. 1A. FIG. 7 illustrates a plurality of pads 705 as an example of an interconnect structures in package substrate 505, which interconnect structures may couple with power loop 100 by way of via 410.

Figure 8:
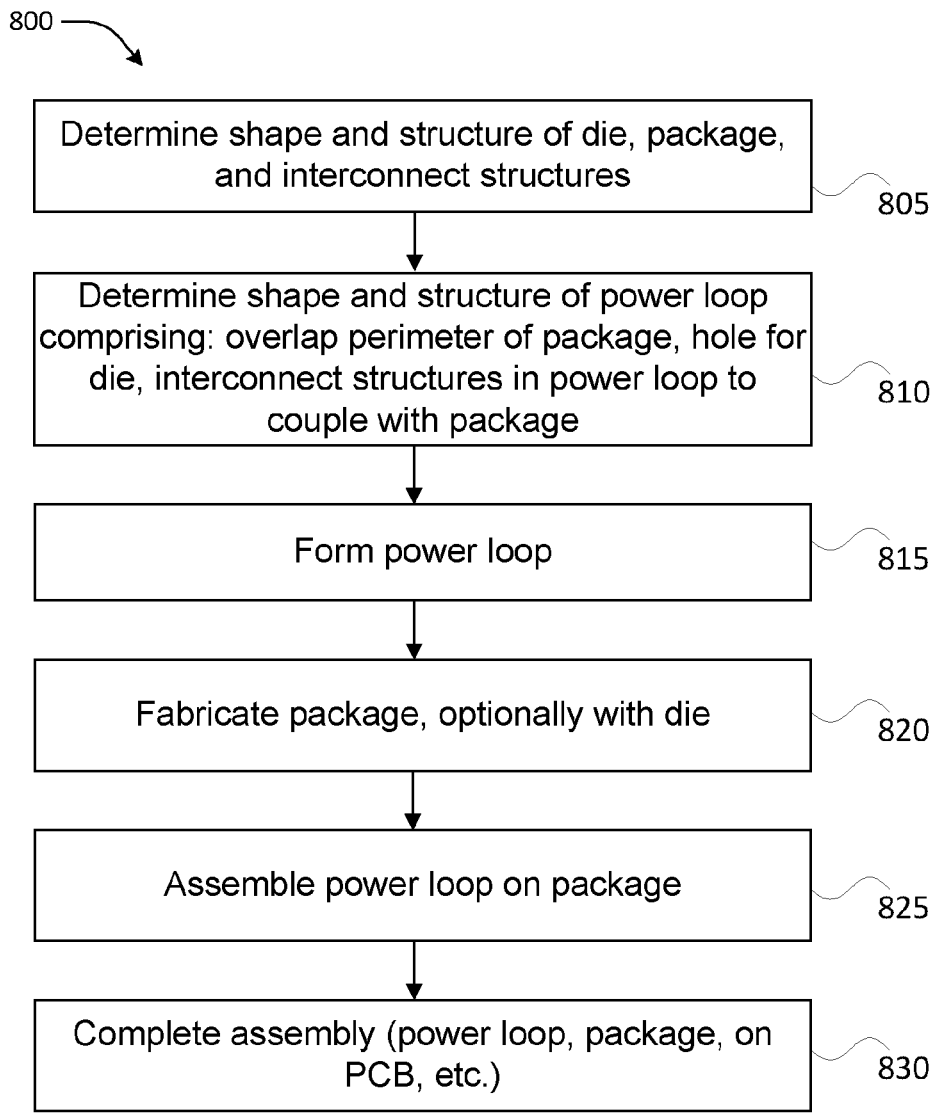
FIG. 8 schematically illustrates a flow diagram for a method of fabricating a power loop structure, package substrate and die, in accordance with some embodiments.

FIG. 8 schematically illustrates a flow diagram 800 for a method of fabricating a power loop, die and package, and PCB structure, in accordance with some embodiments.

At block 805, a shape and structure of a die, package substrate, and interconnect structures in the package substrate may be determined or obtained. The determined or obtained shape and structure may include an external perimeter of one or more dies. The determined or obtained shape and structure may include other electronic or structural components projecting up off of package substrate, in addition to the die. The determined or obtained shape and structure may include other electronic or structural components which should not contact a power loop or which should otherwise be accommodated by an opening in a power loop. The determined or obtained shape and structure may include an external perimeter of the package substrate. The determined or obtained shape and structure may include interconnect structures within or on top of the package substrate.

At block 810, a shape and structure of a power loop may be determined. The shape and structure of the power loop may be determined according to, for example, one or more of the following: i) An overlap with a perimeter of the package substrate of block 805. The amount of overlap may be determined to accommodate structural requirements, fabrication requirements, and/or interconnect requirements. ii) An opening in the power loop defined by the inner perimeter of power loop. The opening in the power loop is to accommodate the die and other structures on or in the package which should not be covered and/or contacted by the power loop. The determined opening in the power loop may be a geometrically similar shape relative to the external perimeter of the die, the external perimeter of the package substrate, and/or a perimeter of other electronic or structural components projecting up off of package substrate. As used herein, geometrically similar shapes may have the same shape and may be of the same or a different size. iii) Interconnect structures in power loop to couple with interconnect structures in the package substrate of block 805.

At block 815, a power loop with the shape and structure determined at block 810 may be formed.

At block 820, the package substrate, optionally including die, of block 805 may be formed.

At block 825, the power loop of block 815 and the package substrate of block 820 may be assembled, such as by coupling the power loop to the package substrate.

At block 830, assembly may be continued or completed, for example, with assembly of the power loop and package substrate of block 825 on a motherboard or PCB.

Embodiments of the present disclosure may be implemented into a system using any suitable hardware and/or software to configure as desired.

Figure 9:
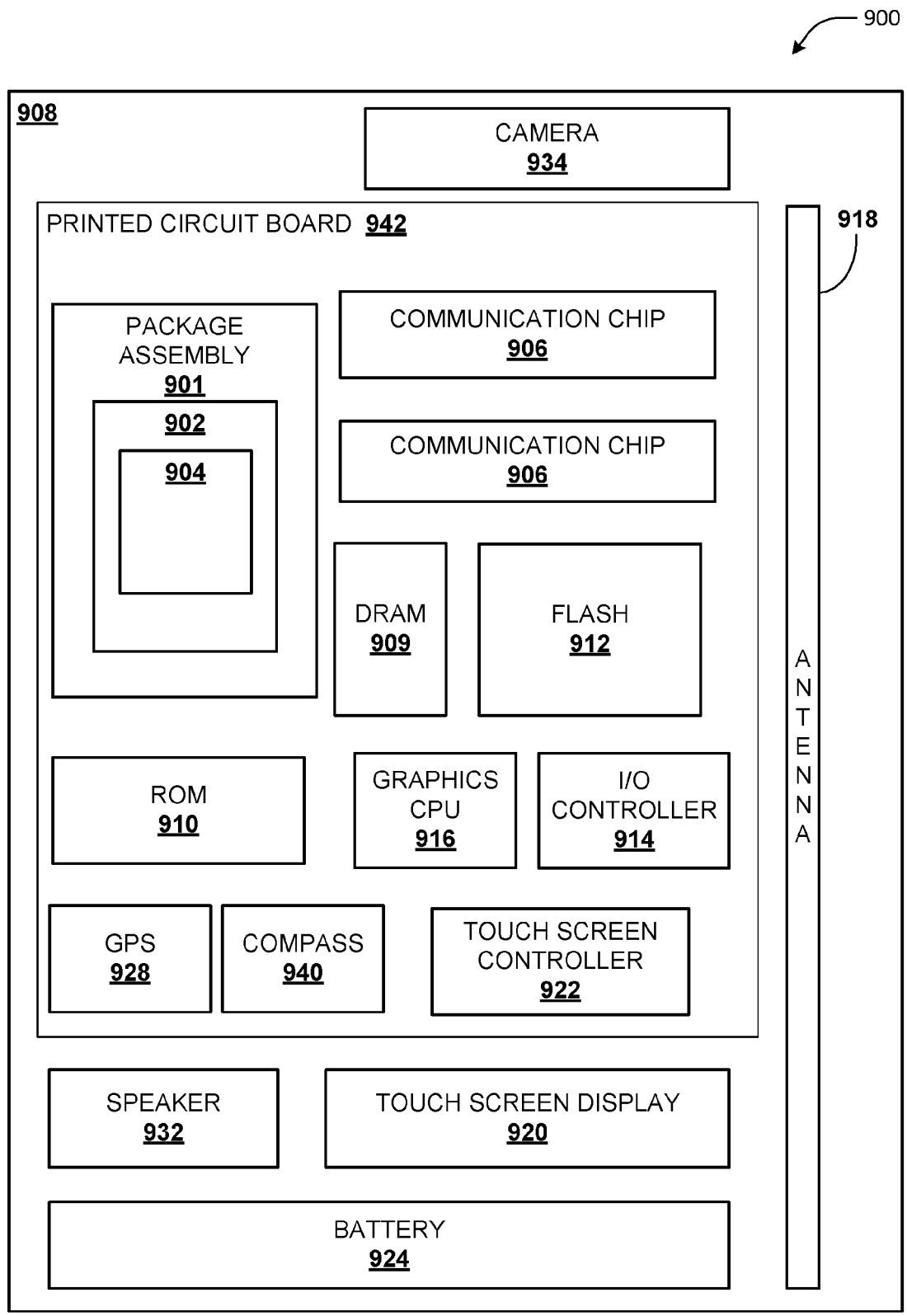
FIG. 9 schematically illustrates a computing device that includes a power loop structure and die and package assembly, in accordance with some embodiments.

FIG. 9 schematically illustrates an example computing device 900 that includes multi-layer package assembly 901 having a power loop 902 (e.g., power loop 100 of FIGS. 1-6) as described herein, in accordance with some embodiments. Package assembly 901 may include die 904 that may be similar to die 205, for example. In some embodiments, die 904 may include one or more processors of computing device 900. In some embodiments, the term "processor" may refer to any device or portion of a device that processes electronic data from registers and/or memory to transform that electronic data into other electronic data that may be stored in registers and/or memory. The processor may include one or more processing cores in various embodiments.

In some embodiments, at least one communication chip 906 may be physically and electrically coupled with package assembly 901. In some embodiments, communication chip 906 may be a part of package assembly 901 (e.g., as an additional die on or embedded in build-up layers in package assembly 901). In various embodiments, computing device 900 may include a board such as PCB 942 that may be in housing 908 in some embodiments. In some embodiments, the board may be a motherboard. Package assembly 901 or communication chip 906 may be disposed on PCB 942 in some embodiments. Various components of computing device 900 may be coupled with each other without employment of PCB 942 in some embodiments.

Depending on its applications, computing device 900 may include other components that may or may not be physically or electrically coupled with PCB 942. These other components may include, but are not limited to, volatile memory (e.g., dynamic random access memory 909, also referred to as "DRAM"), non-volatile memory (e.g., read only memory 910, also referred to as "ROM"), flash memory 912, input/output controller 914, digital signal processor (not shown), crypto processor (not shown), graphics processor 916, antenna 918, display (not shown), touch screen display 920, touch screen controller 922, battery 924, audio codec (not shown), video codec (not shown), chipset (not shown), power amplifier (not shown), global positioning system ("GPS") device 928, compass 940, accelerometer (not shown), gyroscope (not shown), speaker 932, camera 934, or mass storage device (such as hard disk drive, a solid state drive, compact disk (CD), digital versatile disk (DVD), and so forth) (not shown). In some embodiments, various components may be integrated with other components to form a system-on-chip ("SoC"). In some embodiments, some components, such as DRAM 909, may be embedded in the package assembly 901.

Communication chip 906 may enable wireless communications for the transfer of data to and from computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 906 may implement any of a number of wireless standards or protocols, including but not limited to Institute for Electrical and Electronic Engineers (IEEE) standards including WiGig, Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 906 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 906 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. Communication chip 906 may operate in accordance with other wireless protocols in other embodiments.

Computing device 900 may include a plurality of communication chips 906. For instance, a first communication chip 906 may be dedicated to shorter range wireless communications such as WiGig, Wi-Fi, and Bluetooth and a second communication chip 906 may be dedicated to longer range wireless communications such as GPS, EDGE, GPRS, CDMA, WiMAX, LTE, EV-DO, and others.

In various implementations, computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. Computing device 900 may be a mobile computing device in some embodiments. In further implementations, computing device 900 may be any other electronic device that processes data.

The power loop design can intentionally be made to produce large loop inductance through PCB via distribution to form an effective L-C filter for noise isolation purposes. In this case, package real estate required to form physical inductor design can be avoided.

The power loop may result in much lower loop inductance than board decoupling. Board edge caps or backside caps typically have loop inductance in range of 500 pH-2 nH which is 2× to 10× higher than with the described power loop.

Following are examples:

Example 1

An apparatus comprising: a substrate forming a loop around a hole, and an electrical interconnect in the substrate, and a capacitor disposed on the substrate, wherein the capacitor is coupled to the electrical interconnect.

Example 2

The apparatus of Example 1 or any other Example herein, wherein a perimeter of the hole is smaller than an external edge of an integrated circuit package and wherein an area of the hole is larger than an area of an integrated circuit of the integrated circuit package.

Example 3

The apparatus of any of Example 1 to Example 2 or any other Example herein, wherein a perimeter of an external edge of the substrate is one of smaller in length than the external edge of the integrated circuit package or larger in length than the external edge of the integrated circuit.

Example 4

The apparatus of any of Example 1 to Example 3 or any other Example herein, wherein the hole in the substrate and the external edge of the integrated circuit package are a geometrically similar shape.

Example 5

The apparatus of Example 4, wherein the geometrically similar shape is a rectangle.

Example 6

The apparatus of any of Example 1 to Example 5 or any other Example herein, further comprising an external edge of the substrate and wherein the capacitor is disposed on the substrate between the external edge of the substrate and the hole.

Example 7

The apparatus of any of Example 2 to Example 6 or any other Example herein, wherein the electrical interconnect is located above an area of at least a partial overlap between the perimeter of the hole and the external edge of the integrated circuit package.

Example 8

The apparatus of any of Example 1 to Example 7 or any other Example herein, wherein the electrical interconnect comprises a first conducting pad in contact with the capacitor, a second conducting pad on a face of the substrate opposite the capacitor, and a via, wherein the via spans between the first and second conducting pads.

Example 9

The apparatus of Example 8, wherein the second conducting pad is to contact an electrical conductor of the integrated circuit package.

Example 10

The apparatus of any of Example 1 to Example 9 or any other Example herein, further comprising the apparatus electrically coupled to the integrated circuit package.

Example 11

The apparatus of Example 10, wherein the apparatus coupled to the integrated circuit package is the further electrically coupled to a motherboard, wherein the integrated circuit package is electrically coupled to the motherboard by at least one of a solder ball, a pin, or a bump.

Example 12

The apparatus of Example 11, wherein the motherboard comprises a motherboard capacitor and wherein a height of the solder ball is less than a height of the motherboard capacitor above the motherboard.

Example 13

The apparatus of Example 12, wherein the motherboard capacitor is located below the apparatus and next to the integrated circuit package.

Example 14

The apparatus of any of Example 1 to Example 13 or any other Example herein, wherein the capacitor is coupled to the interconnect by at least one of an anisotropic conductive film or a solder.

Example 15

The apparatus of any of Example 1 to Example 14 or any other Example herein, wherein the substrate is one of a rigid material or a flexible material.

Example 16

The apparatus of Example 15, wherein the rigid material comprises at least one of an epoxy, a ceramic, or a rigid plastic and the flexible material comprises a flexible plastic.

Example 17

The apparatus of any of Example 1 to Example 16 or any other Example herein, wherein the capacitor is a first capacitor of a plurality of capacitors disposed on the substrate.

Example 18

The apparatus of any of Example 1 to Example 17 or any other Example herein, wherein the loop is a broken loop.

Example 19

A method of fabricating a loop-shaped power regulator, comprising: forming a substrate in a loop around a hole in the substrate and an electrical interconnect within the substrate; and electrically coupling a capacitor to the electrical interconnect.

Example 20

The method of Example 19 wherein forming the substrate in the loop comprises forming a perimeter of the hole to be smaller than an external edge of an integrated circuit package and with an area of the hole to be larger than an area of an integrated circuit of the integrated circuit package.

Example 21

The method of any of Example 19 to Example 20 or any other Example herein, wherein forming the substrate comprises forming a perimeter of an external edge of the substrate to be one of smaller in length than the external edge of the integrated circuit package or larger in length than the external edge of the integrated circuit.

Example 22

The method of any of Example 19 to Example 21 or any other Example herein, wherein forming the substrate around the hole comprises forming the substrate around the hole with a geometric shape, wherein the geometric shape and the external edge of the integrated circuit package are a geometrically similar shape.

Example 23

The method of Example 22, wherein the geometrically similar shape is a rectangle.

Example 24

The method of any of Example 19 to Example 23 or any other Example herein, wherein forming the substrate further comprises forming an external edge of the substrate and disposing the capacitor on the substrate between the external edge of the substrate and the hole.

Example 25

The method of any of Example 19 to Example 24 or any other Example herein, further comprising forming the electrical interconnect above an area of at least a partial overlap between the perimeter of the hole and the external edge of the integrated circuit package.

Example 26

The method of any of Example 19 to Example 25 or any other Example herein, further comprising forming the electrical interconnect comprising a first conducting pad to contact the capacitor, a second conducting pad on a face of the substrate opposite the capacitor, and a via, wherein the via spans between the first and second conducting pads.

Example 27

The method of Example 26, further comprising forming the second conducting pad to contact an electrical conductor of the integrated circuit package.

Example 28

The method of any of Example 19 to Example 27 or any other Example herein, further comprising electrically coupling the interconnect to the integrated circuit package.

Example 29

The method of Example 28, further comprising electrically coupling the integrated circuit package to a motherboard by at least one of a solder ball, a pin, or a bump.

Example 30

The method of Example 29, wherein a height of the solder ball is less than a height of a motherboard capacitor above the motherboard.

Example 31

The method of Example 19, wherein electrically coupling comprises electrically coupling with at least one of an anisotropic conductive film or a solder.

Example 32

The method of any of Example 19 to Example 31 or any other Example herein, wherein forming the substrate comprises forming the substrate from at least one of a rigid material or a flexible material.

Example 33

The method of Example 32, wherein the rigid material comprises at least one of an epoxy, a ceramic, or a rigid plastic and the flexible material is a flexible plastic.

Example 34

The method of any of Example 19 to Example 33 or any other Example herein, wherein the capacitor is a first capacitor of a plurality of capacitors and the electrical interconnect is a first electrical interconnect of a plurality of interconnects.

Example 35

The method of any of Example 19 to Example 34 or any other Example herein, wherein forming the loop is a broken loop.

Example 36

A computer device comprising: a substrate forming a loop around a hole in the substrate; an electrical interconnect in the substrate; a capacitor disposed on the substrate, wherein the capacitor is coupled to the electrical interconnect; an integrated circuit package; and wherein a perimeter of the hole is smaller than an external edge of the integrated circuit package and an area of the hole is larger than an area of an integrated circuit of the integrated circuit package.

Example 37

The computer device of Example 36, wherein a perimeter of an external edge of the substrate is one of smaller in length than the external edge of the integrated circuit package or larger in length than the external edge of the integrated circuit.

Example 38

The computer device of Example 36 or Example 37 or any other Example herein, wherein the hole and the external edge of the integrated circuit package are a geometrically similar shape.

Example 39

The computer device of Example 38, wherein the geometrically similar shape is a rectangle.

Example 40

The computer device of any of Example 36 to Example 39 or any other Example herein, further comprising an external edge of the substrate and wherein the capacitor is disposed on the substrate between the external edge of the substrate and the hole.

Example 41

The computer device of any of Example 36 to Example 40 or any other Example herein, wherein the electrical interconnect is located above an area of at least a partial overlap between the perimeter of the hole and the external edge of the integrated circuit package.

Example 42

The computer device of any of Example 36 to Example 41 or any other Example herein, wherein the electrical interconnect comprises a first conducting pad in contact with the capacitor, a second conducting pad on a face of the substrate opposite the capacitor, and a via, wherein the via spans between the first and second conducting pads.

Example 43

The computer device of Example 42, wherein the second conducting pad is to contact an electrical conductor of the integrated circuit package.

Example 44

The computer device of any of Example 36 to Example 43 or any other Example herein, further comprising the apparatus electrically coupled to the integrated circuit package.

Example 45

The computer device of any of Example 36 to Example 44 or any other Example herein, wherein the apparatus coupled to the integrated circuit package is the further electrically coupled to a motherboard, wherein the integrated circuit package is electrically coupled to the motherboard by at least one of a solder ball, a pin, or a bump.

Example 46

The computer device of Example 45, wherein the motherboard comprises a motherboard capacitor and wherein a height of the solder ball is less than a height of the motherboard capacitor above the motherboard.

Example 47

The computer device of Example 46, wherein the motherboard capacitor is located below the apparatus and next to the integrated circuit package.

Example 48

The computer device of any of Example 36 to Example 47 or any other Example herein, wherein the capacitor is coupled to the interconnect by at least one of an anisotropic conductive film or a solder.

Example 49

The computer device of any of Example 36 to Example 48 or any other Example herein, wherein the substrate is one of a rigid material or a flexible material.

Example 50

The computer device of Example 49, wherein the rigid material comprises at least one of an epoxy, a ceramic, or a rigid plastic and the flexible material comprises a flexible plastic.

Example 51

The computer device of any of Example 36 to Example 50 or any other Example herein, wherein the capacitor is a first capacitor of a plurality of capacitors disposed on the substrate.

Example 52

The computer device of any of Example 36 to Example 51 or any other Example herein, wherein the loop is a broken loop.

The invention claimed is:

1. An apparatus comprising:
an integrated circuit package substrate;
a capacitor substrate at least partially disposed on package substrate, wherein the capacitor substrate comprises a loop with an external perimeter that defines an external edge of the capacitor substrate, and an inner perimeter that defines a hole in the capacitor substrate, wherein the hole comprises an opening provided through the capacitor substrate, wherein the capacitor substrate partially overhangs the package substrate, forming a first area that is directly disposed on the package substrate, and a second area that extends from the first area and that overhangs the package substrate;
at least one capacitor disposed on the capacitor substrate in a space formed between the external and inner perimeters, wherein a first portion of the capacitor is disposed on the first area that is directly disposed on the package substrate, and a second portion of the capacitor is disposed on the second area that overhangs the package substrate;
a first electrical interconnect provided through the first area of the capacitor substrate that is directly disposed on the package substrate to electrically couple the first portion of the capacitor with the package substrate; and
a second electrical interconnect provided through the second area of the capacitor substrate that overhangs the package substrate, to electrically couple the second portion of the capacitor with the package substrate or other electric components.

2. The apparatus according to claim 1, wherein a perimeter of the hole is smaller than the external edge of the integrated circuit package substrate, wherein the hole and the external edge of the integrated circuit package are a geometrically similar shape.

3. The apparatus according to claim 2, wherein the first electrical interconnect comprises a first conducting pad in contact with the capacitor, a second conducting pad on a face of the substrate opposite the capacitor, and a via, wherein the via spans between the first and second conducting pads and wherein the second conducting pad is to contact an electrical conductor of the integrated circuit package substrate.

4. The apparatus according to claim 3, wherein the integrated circuit package substrate is electrically coupled to a motherboard by at least one of a solder ball, a pin, or a bump.

5. The apparatus according to claim 4, wherein the motherboard includes a motherboard capacitor, and wherein a height of the solder ball is less than a height of the motherboard capacitor, and wherein the motherboard capacitor is disposed on the motherboard below the second area of the capacitor substrate.

6. The apparatus according to claim 1, wherein the capacitor is a first capacitor of a plurality of capacitors disposed on the capacitor substrate.

* * * * *